(12) United States Patent
Pylant et al.

(10) Patent No.: US 9,224,627 B2
(45) Date of Patent: Dec. 29, 2015

(54) SINGLE AND DUAL STAGE WAFER CUSHION AND WAFER SEPARATOR

(75) Inventors: James D Pylant, Temecula, CA (US); Christopher R Mack, Broomfield, CO (US); Alan L Waber, Wildomar, CA (US); David A Miller, Colorado Springs, CO (US)

(73) Assignee: TEXCHEM ADVANCED PRODUCTS INCORPORATED SDN BHD, Bayan Lepas (MY)

( * ) Notice: Subject to any disclaimer, the term of this patent is extended or adjusted under 35 U.S.C. 154(b) by 67 days.

(21) Appl. No.: 13/172,565

(22) Filed: Jun. 29, 2011

(65) Prior Publication Data
US 2012/0205282 A1    Aug. 16, 2012

Related U.S. Application Data

(63) Continuation-in-part of application No. 13/028,945, filed on Feb. 16, 2011.

(51) Int. Cl.
| | |
|---|---|
| *A47B 91/00* | (2006.01) |
| *A47G 29/00* | (2006.01) |
| *H01L 21/673* | (2006.01) |

(52) U.S. Cl.
CPC .... *H01L 21/67369* (2013.01); *H01L 21/67346* (2013.01); *H01L 21/67379* (2013.01)

(58) Field of Classification Search
CPC   C23C 16/4583; C23C 16/4584; C30B 25/12; H01L 21/67369; H01L 21/67346; H01L 21/67379

USPC ............. 248/560, 346.11; 206/313, 309, 815, 206/804; 414/587, 586, 804; 118/728, 725, 118/724

See application file for complete search history.

(56) References Cited

U.S. PATENT DOCUMENTS

| | | |
|---|---|---|
| 2,557,835 A | 6/1951 | Monahan |
| 3,392,824 A | 7/1968 | Flynn |

(Continued)

FOREIGN PATENT DOCUMENTS

| | | |
|---|---|---|
| CN | 1391506 A | 1/2003 |
| EP | 0508684 A2 | 10/1992 |

(Continued)

OTHER PUBLICATIONS

Extended European Search Report and Written Opinion issued in EP 12747127 dated Jan. 27, 2015.

(Continued)

*Primary Examiner* — Amy Sterling
(74) *Attorney, Agent, or Firm* — Sam K. Tahmassebi

(57) ABSTRACT

Improvements in a single and dual stage wafer cushion is disclosed where the wafer cushion can use an edge hinge as a single first stage cushion and a second mid span hinge for the dual stage wafer cushion. This dual stage design gives two distinctly different cushioning forces as opposed to using a single stage design where the force is linear with the amount of compression that is being applied to the outer surfaces of the wafer cushion. The outside edge of the ring provides the greatest expansion such that only the outer edge of the ring makes contact with the outer edge of a wafer. The wafer cushion is a material that flexes and absorbs shocks before the shock is transferred to the wafer stack. The material minimizes debris or contaminants from embedding into the wafer cushion and also prevents sheading of material from the wafer cushion.

7 Claims, 7 Drawing Sheets

(56) References Cited

U.S. PATENT DOCUMENTS

| | | |
|---|---|---|
| 3,552,548 A | 1/1971 | Wallested |
| 4,021,048 A * | 5/1977 | Fowler et al. .................. 369/212 |
| 4,316,281 A * | 2/1982 | Prusak ....................... 369/272.1 |
| 4,340,188 A | 7/1982 | Derendorf et al. |
| 4,736,840 A * | 4/1988 | Deiglmeier ................ 206/308.1 |
| 5,366,079 A | 11/1994 | Lin et al. |
| 5,474,177 A | 12/1995 | Abrams |
| 6,119,865 A | 9/2000 | Kawada |
| 6,286,684 B1 | 9/2001 | Brooks et al. |
| 6,474,987 B1 * | 11/2002 | Nakai et al. ................... 432/258 |
| 6,926,150 B2 | 8/2005 | Amador et al. |
| 7,059,475 B2 | 6/2006 | Zabka et al. |
| 7,316,312 B2 | 1/2008 | Chiu |
| 7,425,362 B2 | 9/2008 | Thomas et al. |
| 7,530,462 B2 | 5/2009 | Yajima et al. |
| 7,588,150 B2 | 9/2009 | Kasama |
| 7,611,766 B2 | 11/2009 | Fuyumuro |
| 2002/0144927 A1 | 10/2002 | Brooks et al. |
| 2003/0137089 A1 | 7/2003 | Rode |
| 2004/0149623 A1 | 8/2004 | Amador et al. |
| 2007/0095685 A1 | 5/2007 | Chiu |
| 2007/0145655 A1 | 6/2007 | Rode |
| 2009/0266740 A1 | 10/2009 | Kasama |

FOREIGN PATENT DOCUMENTS

| | | |
|---|---|---|
| JP | 2009043862 A | 2/2009 |
| WO | 0002798 A1 | 1/2000 |

OTHER PUBLICATIONS

Office Action issued by the JPO in Japanese application No. 2013-554410 dated Mar. 17, 2015—incl Engl lang transl.

Office Action issued by SIPO in Chinese application No. 201180069781.4 dated Jul. 21, 2015—incl Engl lang transl.

* cited by examiner

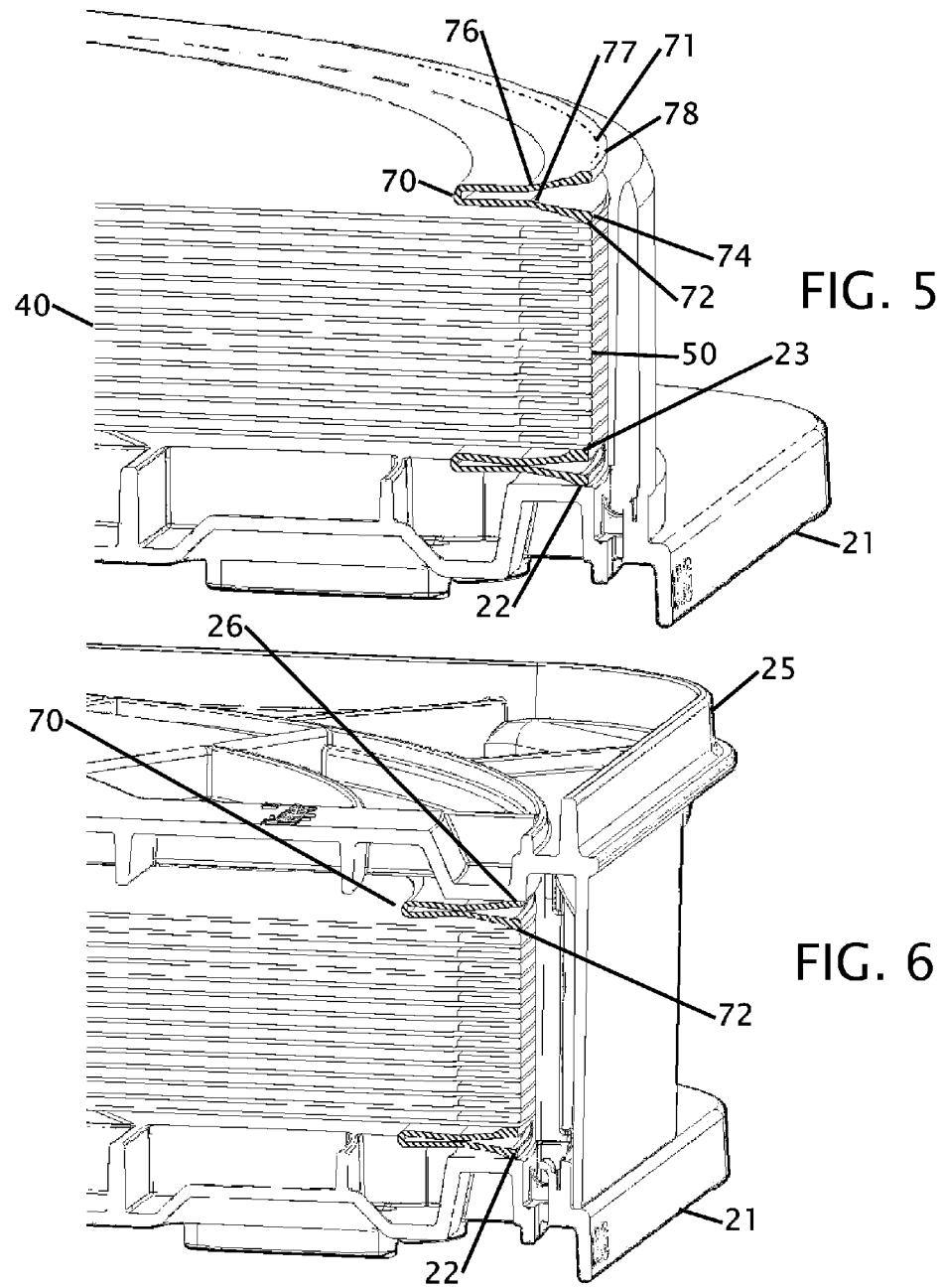

SINGLE AND DUAL STAGE WAFER CUSHION AND WAFER SEPARATOR

CROSS REFERENCE TO RELATED APPLICATION

This application is a continuation-in-part of applicant's co-pending application Ser. No. 13/028,945 filed Feb. 16, 2011, the entire contents of which is hereby expressly incorporated by reference herein.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This invention relates to improvements in a cushioning device for cushioning and separating a stack of semiconductor wafers within a wafer transportation container. More particularly, the present cushioning device is a formed or folded ring with compound bends and surfaces that provide variable amounts of cushioning as the compound bends and surfaces engage.

2. Description of Related Art Including Information Disclosed under 37 CFR 1.97 and 1.98

When semiconductor wafers are placed within a transportation container the stack of wafers are either loose or are compressed against the opposing houses. In either case, transportation of the semiconductor wafers can cause abrasion to some or all of the stacked wafers. Some patents have been filed using separator sheets, pads or foam rings to cushion the outer semiconductor wafers and absorb shock and movement as the semiconductor wafers are being transported.

Limiting radial movement becomes an important issue when shipping to prevent abrasion of the prime wafer surface, which may or may not contain circuitry. This is also true for bumped wafers that may or may not be stacked on spacer rings where the rings must only touch the periphery of the wafer and not shift radially into the areas containing the solder bumps. The Wafer Cushioning Rings ability to protect semiconductor wafers is enhanced when using a wafer container that reduces radial wafer shift.

If a rigid spacer is used the spacer can cause harm to the wafers and may not provide sufficient grip on the wafers to prevent movement. If a foam spacer is used the foam spacers are susceptible to damage and aging. Several products and patents have been filed that disclose these features. Exemplary examples of patents covering these products are disclosed herein.

U.S. Pat. No. 3,392,824 issued Jul. 16, 1968 to S. F. Flynn and U.S. Pat. No. 5,366,079 issued Oct. 22, 1994 to Chih-Ching Lin et al., both disclose packaging system for cushioning circuit wafer where the cushioning system is a Bellville type platter or a platter with flexed legs that extend from the center of the platter. While these patents disclose a cushioning system for wafers the cushions slide radially on the outer surface of the wafers as the spacers are crushed within the transportation housing. This can cause damage to the wafers.

U.S. Pat. No. 6,926,150 issued Aug. 9, 2005 to Gonzlo Amador et al., and U.S. Pat. No. 7,530,462 issued May 12, 2009 to Toshitsugu Yajima et al., both disclose a wafer cushion using a rigid disk space. These patents are more related to spacers between the semiconductor wafers rather that providing cushioning and gap filling. In a number of cases these spacers are supplemented with foam pads located either across the entire surface of the wafer or on just the outer edges of the wafer.

U.S. Pat. No. 7,425,362 issued Sep. 16, 2008 to James R. Thomas et al and U.S. Pat. No. 7,611,766 issued to Masahiko Fuyumuro on Nov. 3, 2009 discloses a wavy pad where the high and low parts of the pad fill the space between the wafers and the transportation housing. These pads are made from a variety of materials from plastic to paper and are fabricated in variable profiles to accommodate the space between the wafers and transportation housing.

U.S. Pat. No. 6,926,150 issued Aug. 9, 2005 to Gonzalo Amador et al., U.S. Pat. No. 7,316,312 issued Jan. 8, 2008 to Pei-Liang Chiu and U.S. Patent Application Number 2002/0144927 to Ray G. Brooks et al that published on Oct. 10, 2002 discloses a foam pad or ring to cushion the wafers within the packaging. The amount of force that is applied by a foam pad can be a significant variable as the foam ages. Foams can also be a cause of contamination as the foam cell structure breaks down. Foam particles can also be a contaminant that interferes with the doping of semiconductor wafers. In some cases the foam makes contact with the entire surface of the wafers and can cause deformation of the wafer(s).

What is needed is a cushioning ring that has a variable amount of cushioning to accommodate the minor variation on the top and bottom of a stack of semiconductor wafers. The pending design provides this solution with a single and dual stage wafer cushion.

BRIEF SUMMARY OF THE INVENTION

It is an object of the single and dual stage wafer cushion to operate with a wafer carrier where the cushion can be placed on both the bottom of the wafer carrier and on the top of wafers that are placed within the carrier. The cushion expands and collapses to accommodate variations in wafer thicknesses and variation in carrier housings. While the variation in wafer thickness on an individual wafer may be small, when the variations are accumulated the gap can be larger than desired. The cushioning provides minimal forces on the wafers and the housing to make the housing easy to open and further limit movement of the wafers within the wafer carrier.

It is an object of the single and dual stage wafer cushion to be manufactured to fit within the housing of a wafer carrier. The shape of the cushion is a folded ring where the fold is open on the outside diameter. The outside edge of the ring provides the greatest expansion such that only the outer edge of the ring makes contact with the outer edge of the wafer. This minimizes the contact area with wafer and places any axial load on the outer edge surface of the wafer where a wafer typically is placed on a separator disk to minimize damage to the inner surface of the wafers and minimize flexing of the center of the wafer(s).

It is an object of the wafer separator to provide a separation between stacked wafer to prevent damage to the wafers and or components that are placed or bonded onto the wafers.

It is an object of the wafer separator for the separator to provide a plurality of vents around the peripheral edge of the wafer separator to allow air passage between wafers. The vents reduce the pressure or vacuum that is created when the flat wafers are brought together and pulled away from each other. The number and configuration of the vents are variable based upon the diameter and other factors of the wafers.

It is another object of the single and dual stage wafer cushion to be made of a material where it can flex and absorb any shocks before the shock is transferred to the wafer stack. The material can be molded, thermoformed, cast or vulcanized.

It is another object of the single and dual stage wafer cushion to be made with a cross section shape having only half a "V" where the ring would be attached by bonding or clipping to the top and or bottom cover such that the cover provides the limiting function of the missing half of the "V". This design would be capable of having a single or dual stage version. This design allows single or multiple arms or "V rings" to be stacked to take up excess space inside the box.

It is another object of the single and dual stage wafer cushion to be made from a non-absorbent material. This prevents debris or contaminants from embedding into the wafer cushion and also prevents sheading of material from the wafer cushion.

It is still another object of the single and dual stage wafer cushion to use both an edge hinge as a single first stage hinge and a second mid span hinge for the dual stage wafer. This dual stage design gives two distinctly different cushioning forces as opposed to using a single stage design where the force is liner with the amount of compression that is being applied to the outer surfaces of the wafer cushion.

Various objects, features, aspects, and advantages of the present invention will become more apparent from the following detailed description of preferred embodiments of the invention, along with the accompanying drawings in which like numerals represent like components.

BRIEF DESCRIPTION OF THE SEVERAL VIEWS OF THE DRAWING(S)

FIG. 5 shows an isometric view of the single and dual stage wafer cushion on a stack of semiconductor wafers without the top housing of the wafer shipper installed.

FIG. 6 shows an isometric view of the single and dual stage wafer cushion on a stack of semiconductor wafers with the top housing of the wafer shipper installed.

DETAILED DESCRIPTION OF THE INVENTION

Figure 1:
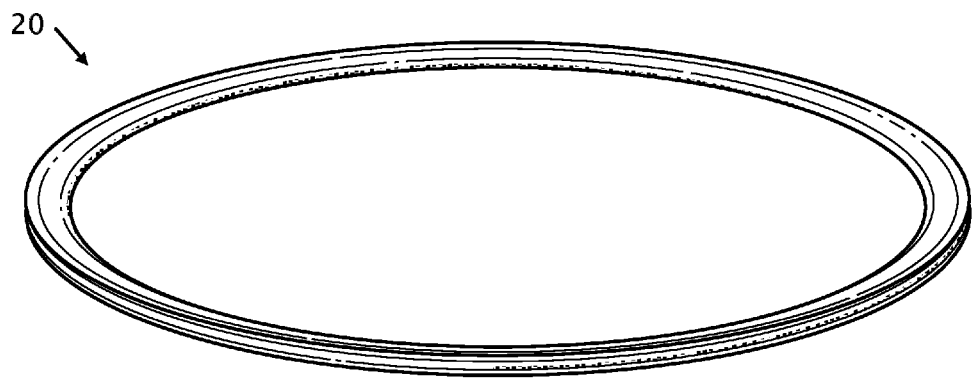
FIG. 1 shows an isometric view of a single and dual stage wafer cushion.
Figure 2:
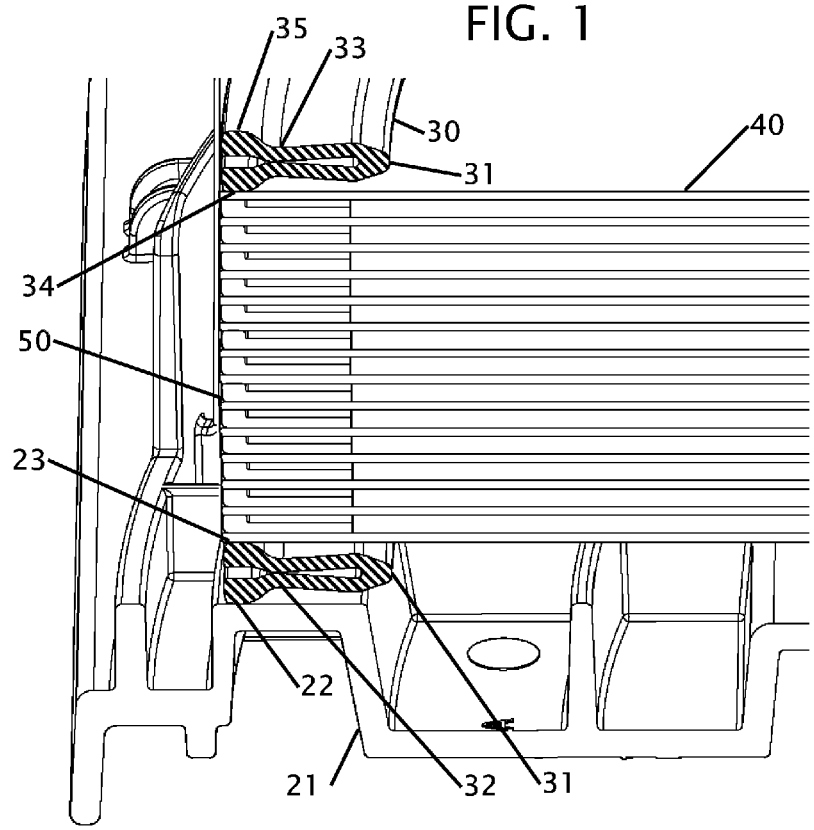
FIG. 2 shows an isometric sectional view of the single and dual stage wafer cushion.

FIG. 1 shows an isometric view of a single and dual stage wafer cushion 20 and FIG. 2 shows an isometric sectional view of the single and dual stage wafer cushion. The single and dual stage wafer cushion 20 from FIG. 1 shows essentially a ring shaped cushion where the inside of the wafer cushion 20 is open. In the preferred embodiment two single and dual stage wafer cushions 20 are placed on a stack of semiconductor wafers 40 as shown in FIG. 2. The stack of semiconductor wafers in this figure includes spacer rings 50 are placed between each semiconductor wafer 40. The spacers 50 allow for stacking of "Bumped" wafers substrates with tiny solder balls used for electrical interconnection to the final product or external circuitry. Bumped wafer stacks are normally used with solid height, non-adjustable spacer rings 50 between the wafers to prevent the solder balls (bumps) from being damaged by contact with adjacent substrates 40.

This first preferred embodiment is a ring designed with a dual spring rate or variable spring rate. The dual stage version 20 has one spring rate for easy loading and closing of the shipper top cover (not shown), whereas the second stage of the spring provides a stiffer spring rate to absorb energy if the shipper is dropped or mishandled, thus protecting the wafer stack or substrate stack.

With the cushion configured as a "V Ring" the cross section is shaped like a "V" to provide a spring or cushioning for the wafers. This design lends itself to the injection molding process, vulcanization or other manufacturing methods with the V shaped cross section. The tip 23 of the V provides the point of contact to the wafer and the shipping container. There is also a case where multiple stacking "V rings" can be used to take up excess space inside the wafer shipping container. One advantage of the "V" shape is that it allows the ring to only contact a small zone 23 and 34 on the wafer 40 near the perimeter. For bumped wafers, there is normally a 3 mm wide exclusion zone for circuitry or solder bumps that extends inward from the perimeter of the wafer. Our preferred embodiment has a slightly raised zone with radius at the point of wafer contact, but it does not have to have this feature. The slightly raised area at the tip of the "V" allows additional clearance for any solder bumps that are near the "keep out" zone. FIG. 2 shows a two separate wafer cushions with a lower cushion placed into the wafer carrier 21 under all of the wafers 40. The outside diameter edge 23 of the lower cushion is sized to fit within the wafer carrier 21 with the lower bottom surface 22 supported on the bottom of the wafer carrier 21 support.

The weight of the wafers 40 and support rings 50 at least partially load the lower wafer cushion whereby at least partially compressing the lower cushion such that the first stage or inside diameter 30 hinge 31 of the wafer cushion at least partially compress the wafer cushion. It should be noted from FIG. 2 that when the first stage is compressed a second cushion gap is still visible both inside and outside of the middle surface 32. FIG. 2 further shows that when the first stage has made contact only the outer diameter edge 34 makes contact with the outer edge of the semiconductor wafer 40 and the remaining inner diameter surfaces of the wafer cushion "float" above the semiconductor wafer without making contact with the surface of the semiconductor wafer(s). When the top housing (not shown) of the wafer carrier is installed the top housing compresses the top surface 35 of the upper wafer cushion and loads the lower wafer cushion whereby providing even cushion between the top and the bottom wafer cushion.

Figure 3:
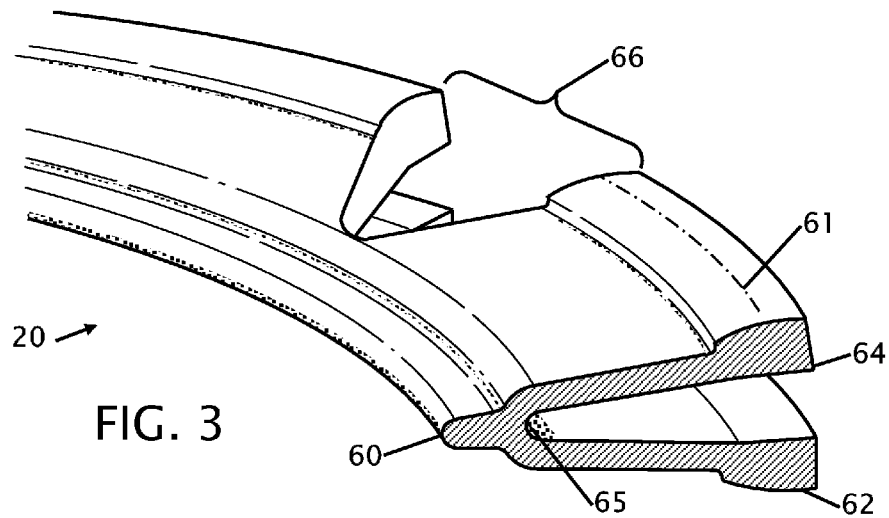
FIG. 3 shows an isometric sectional view of the single and dual stage wafer cushion in a second preferred embodiment.

FIG. 3 shows an isometric sectional view of the single and dual stage wafer cushion in a second preferred embodiment. In this embodiment the wafer cushion 20 has an inner lip 60 that provides additional strength for the hinge 65 and also provides a gripping surface for easier removal of the wafer cushion 20. The outside diameter 64 is sufficiently sized to center the wafer cushion within a wafer carrier. The top 61 and bottom surface 62 of the wafer cushion 20 has a slight radial curve to maintain contact with just the outer edge top or bottom surface of a semiconductor wafer. It is further contemplated that a portion 66 of the cushion can be broken, serrated or formed to create multiple finger portions that independently flex from the inside diameter hinge 65. In the embodiment shown the void areas 66 exists through both the upper and lower lips or arms but could also be formed to exist only through one leg of the cushion whereby leaving the other leg continuous. At the first stage of compression the inside outer surfaces 64 of the wafer cushion come in contact and leave an air gap from the inside hinge area 65 to the outer surfaces to provide the second stage of cushioning.

Figure 4:
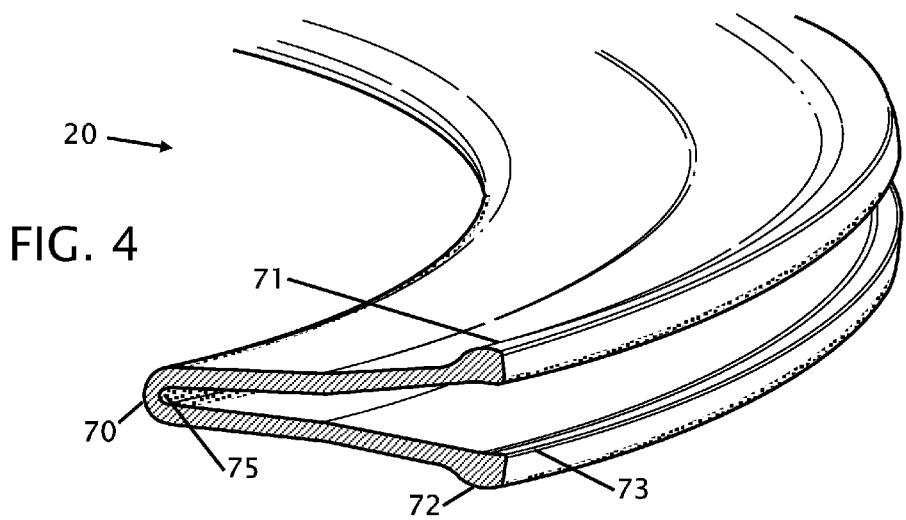
FIG. 4 shows an isometric sectional view of the single and dual stage wafer cushion in a third preferred embodiment.

FIG. 4 shows an isometric sectional view of the single and dual stage wafer cushion 20 in a third preferred embodiment. This third preferred embodiment will be briefly described in this figure and described in more detail in FIGS. 5 to 10. This embodiment has a plurality of flexible arms that extend from the inside diameter hinge area 70 and 75. The extreme upper and lower surfaces 71 make contact with the outer upper and lower surfaces of a semiconductor wafer when the wafer cushion is installed in a wafer carrier. The extreme outer diameters(s) 73 are sufficiently sized to fit within a wafer carrier and provide little or no movement within the wafer carrier. The wafer cushion is shown in an expanded and in a first stage compressed stage in FIGS. 5 and 6 within a wafer carrier.

FIG. 5 shows an isometric view of the single and dual stage wafer cushion on a stack of semiconductor wafers without the top housing of the wafer shipper installed and FIG. 6 shows an isometric view of the single and dual stage wafer cushion on a stack of semiconductor wafers with the top housing of the wafer shipper installed. From FIG. 5 and 6 the lower cushion is compressed with the lower lip 22 in contact with the bottom housing 21 and the upper lip 23 in contact with the lowest semiconductor wafer 40. The stack of semiconductor wafers 40 are each separated with a wafer separator 50 placed between each semiconductor wafer 40. In FIG. 5 the upper wafer cushion is shown uncompressed where the first or single stage of cushion is not compressed and the middle of the extended arms are not in contact at mid span 76 and 77. The bottom surface of the wafer cushion at 72 is in contact with the outer top surface of the top semiconductor wafer 40. The tangent arched top surface of the wafer cushion 71 provides generally just a linear point contact with the semiconductor wafer 40 and the top 25 or bottom 21 housing. The outer edge 74 and 78 of the cushion approximates the outside diameter of the semiconductor wafers 40.

When the top housing 25 is lowered onto the wafer cushion the arms will move closer together as they hinge from the inner radius 70. When the housings 21 and 25 are secured the top housing will push upon the outer edge 26 of the top wafer cushion and the central portion 77 of the arms will make contact and form the first stage of cushion.

Figure 7:
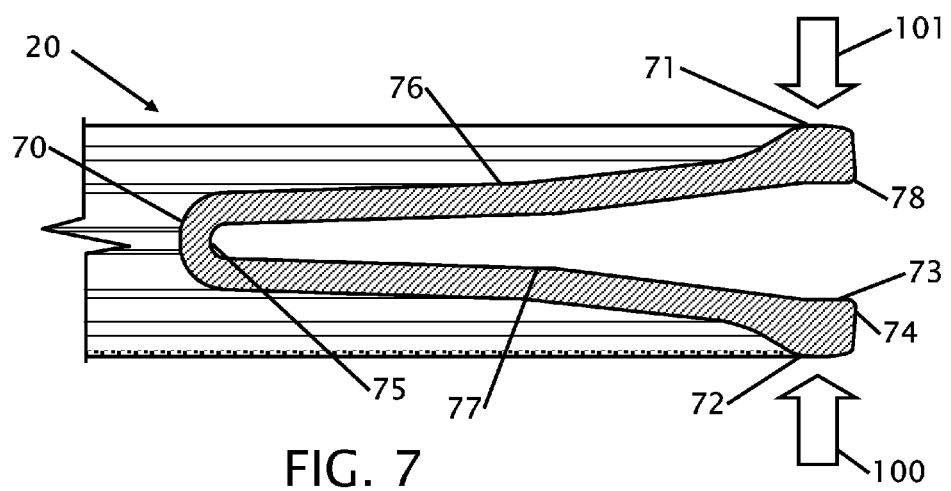
FIG. 7 shows a side sectional view of the single and dual stage wafer cushion with the wafer cushion in an uncompressed condition.
Figure 8:
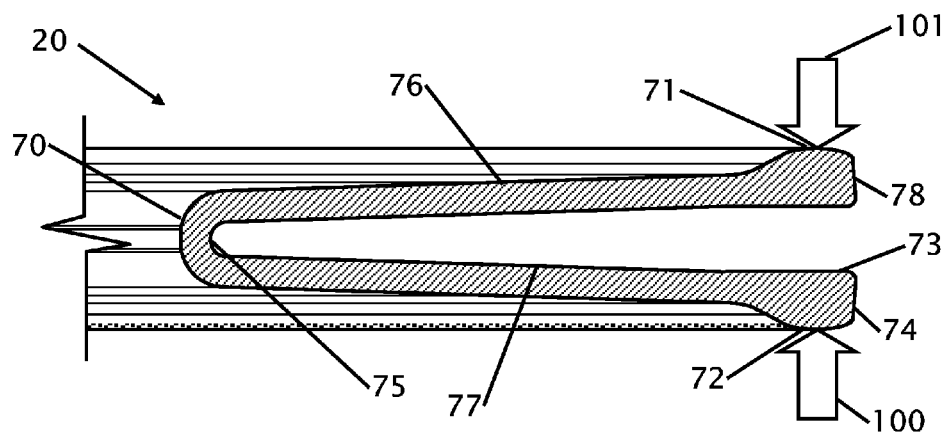
FIG. 8 shows a side sectional view of the single and dual stage wafer cushion with the wafer cushion initially compressed.
Figure 9:
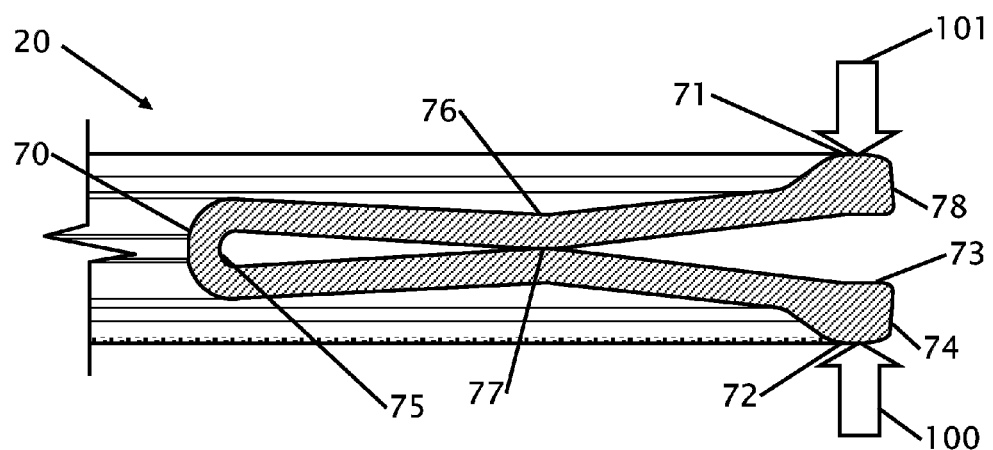
FIG. 9 shows a side sectional view of the single and dual stage wafer cushion with the wafer cushion partially compressed.
Figure 10:
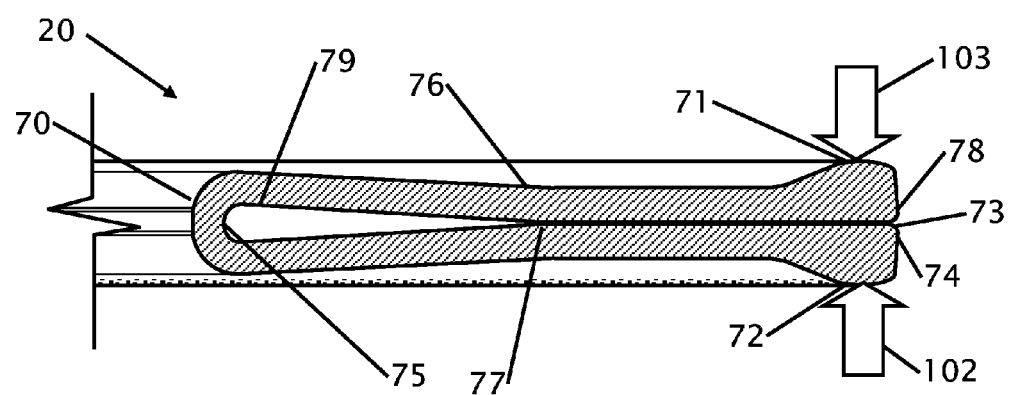
FIG. 10 shows a side sectional view of the single and dual stage wafer cushion with the wafer cushion more fully compressed.

FIG. 7 shows a side sectional view of the single and dual stage wafer cushion with the wafer cushion in an uncompressed condition, FIG. 8 shows a side sectional view of the single and dual stage wafer cushion with the wafer cushion initially compressed, FIG. 9 shows a side sectional view of the single and dual stage wafer cushion with the wafer cushion partially compressed and FIG. 10 shows a side sectional view of the single and dual stage wafer cushion with the wafer cushion more fully compressed. Starting with FIG. 7 the wafer cushion 20 is in a natural uncompressed condition without any forces 100 and 101 causing the cushion to compress. The hinge 70 and 75 creates a curve to keep the arms on an open "U" or "V" configuration. The top 71 and bottom surfaces 72 of the wafer cushion are at the greatest dimension. The outer lip 74 and 78 are essentially the same dimension, but it is contemplated that they can exist at different radii as well. The central 76 and 77 or second (dual) stage of the arms open and not in contact.

In FIG. 8 forces 100 and 101 cause the arms to compress and the interior area begins to compress. Both the end 70, 73 and the mid-section elbow, profile or hinges 76 and 77 flex as the force increases until the inner surfaces of the arms make contact as shown in FIG. 9. The force 100 and 101 creates a first load or spring constant profile.

At this stage the resisting spring force to provide a cushion changes because the length of the lever arms has been shortened. In the embodiment shown the contact between the arm segments is approximately at mid span, but it is contemplated that the central contact can take place at any point in the span of the arms to yield a different cushion force profile. The profile shown in FIG. 9 represents the condition where the housings are closed and in a normal shipping mode. Additional applied force between the forces shown in FIGS. 9 and 10 100/101 verses 102/103 provides a second load or spring constant that is different from the load or spring constant as applied from FIGS. 7 to 9. The spring constant can be linear stepped or non-linear based upon the shape, angles and constant or variable thicknesses of the hinge and or leg section(s).

FIG. 10 shows a shock load condition that might occur when the wafer carrier is dropped or bumped. The forces 102 and 103 continue to push on the extreme ends of the arms. The outer lengths of the arms are in compression along their length(s). It should be noted that even at this loading an air gap 79 still provides some further cushioning and the inside on the cushion still provides a space for clearance of components that may be placed on the semiconductor wafers.

Figure 11:
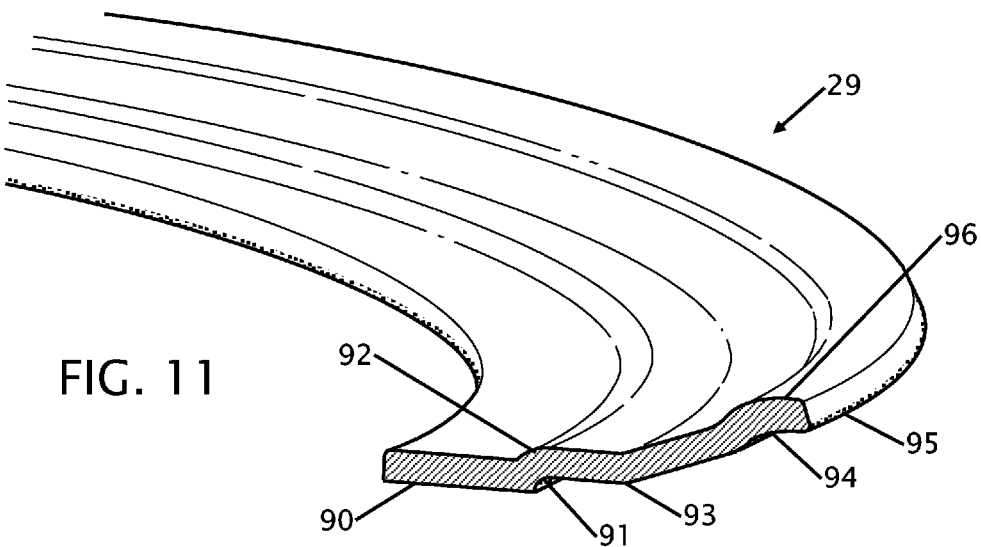
FIG. 11 shows an isometric sectional view of the single and dual stage wafer cushion in a fourth preferred embodiment.
Figure 12:
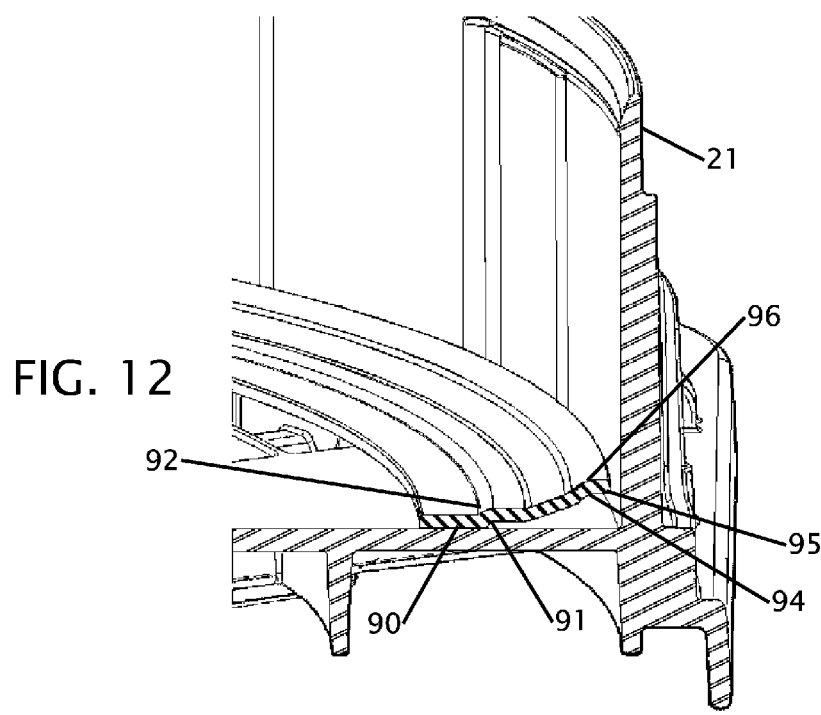
FIG. 12 shows an isometric view of the single and dual stage wafer cushion from the fourth preferred embodiment bonded to the bottom housing without wafers installed upon the wafer cushion.

FIG. 11 shows an isometric sectional view of the single and dual stage wafer cushion 29 in a fourth preferred embodiment and FIG. 12 shows an isometric view of the single and dual stage wafer cushion from the fourth preferred embodiment bonded to the bottom housing without wafers installed upon the wafer cushion.

"Single Sided Ring"—One version of the cushioning ring 29 described above is a ring with a cross section shape having only half a "V" where the ring would be attached, (bonded or clipped) to the top or bottom cover such that the cover provides the limiting function of the missing half of the "V". This design would be capable of having a single or dual stage version. This design allows multiple "V rings" to be stacked to take up excess space inside the box. The bottom of this cushion 90 can be bonded to the lower housing 21 (or 25). While this single sided ring has only one arm the arm has a similar configuration with an inside hinge area 91 and 92, a mid-span elbow 93 to form a division between the first and second stage of the cushion. The outer edge 95 is sized to provide clearance of the housing 21 wall to provide free movement and flexing. The top edge of the wafer cushion 96 is configured to make contact with just the outer edge of the wafer separator or the semiconductor wafer (not shown). The lower radii 94 provide additional shock cushioning when the wafer stack flattens the majority of the wafer cushion 29.

In the preferred embodiment the wafer cushion is made from a compliant material having a hardness of shore D of between 10 and 70 but other hardness are contemplated based upon the material that is being cushioned and the stack height/weight that is being cushioned. It is also contemplated that the upper and lower wafer cushions being used in a wafer shipper can have different properties and configurations based upon the weight or the fact that the semiconductor wafers exist above or below the wafer cushions. The profile from the central hinge to the outer contact points can be curved, or have variable cross section, or multiple steps, profiles, elbows or bends to achieve non-linear cushion forces or multiple stage wafer cushions.

Figure 13:
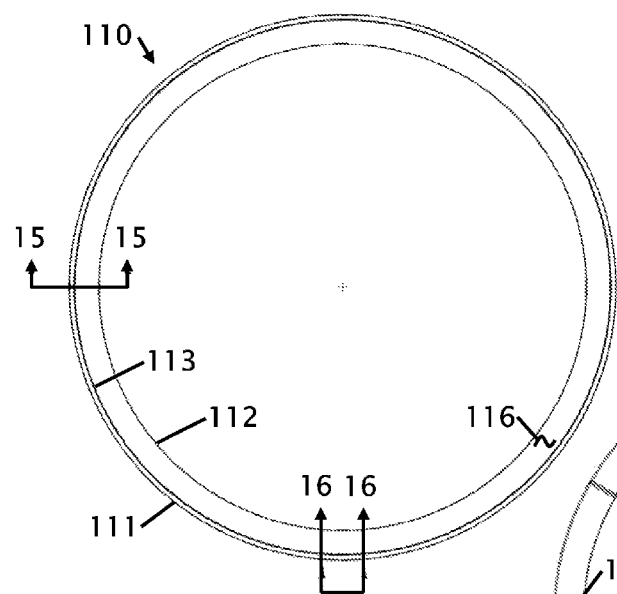
FIG. 13 shows a top view of one embodiment of the wafer separator.
Figure 14:
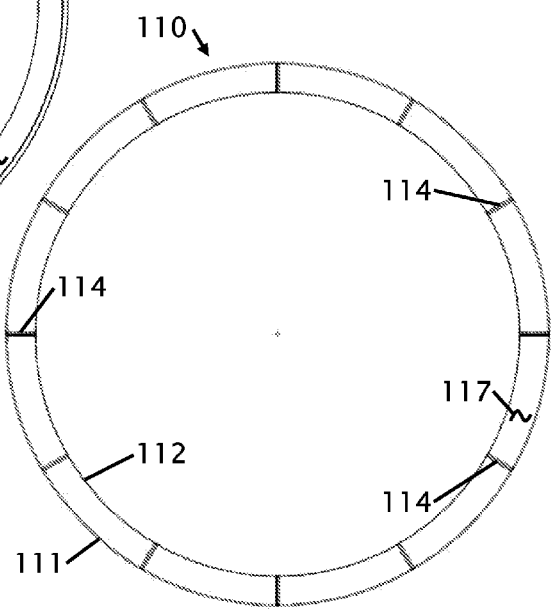
FIG. 14 shows a bottom view of one embodiment of the wafer separator.
Figure 15:
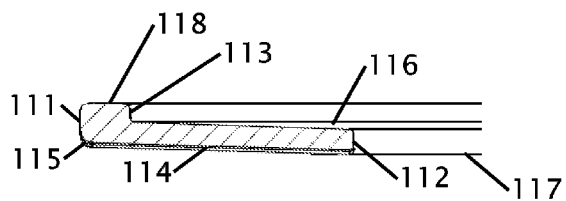
FIG. 15 shows a sectional view of the wafer separator cut though section 15-15.
Figure 16:
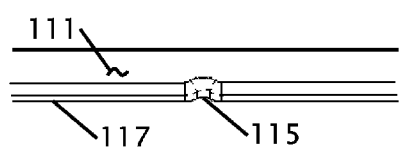
FIG. 16 shows an outside view of the wafer separator cut through section 16-16.

FIG. 13 shows a top view of one embodiment of the wafer separator 110, FIG. 14 shows a bottom view of one embodiment of the wafer separator 110, FIG. 15 shows a sectional view of the wafer separator 110 cut though section 15-15 and FIG. 16 shows an outside view of the wafer separator 110 cut through section 16-16. The wafer separator 110 has an open central area. An outer raise lip 111 has a bottom lower surface 117 and a top surface 118. The bottom 117 and top 118 surfaces create the spacing between adjacent wafers 40 (from FIG. 1). Wafers are centered and placed onto the middle surface 116 where the middle lip 113 of the wafer separator 110 cushions axial loads on a wafer. The bottom surface 117 and the middle surface and slightly angled from the inside diameter 112 to the outside diameter to provide a cushion of placement and grasping of wafer(s).

The middle surface provides a space between adjacent wafers for the prime surface of the wafer, clearance of components, bond pads, solder bumps, solder balls, post passivation interconnects, and conductor lines on wafers. The bottom lower surface 117 of the wafer separator 110 (as shown in FIG. 14) has a plurality of vents 114. The vents extend from the inside diameter surface 112 to the outer diameter 111. The vents are "V", "U", square, rectangular or a combination thereof in profile. The vents allow air to pass from under the wafer to reduce the vacuum and pressure when a wafer is being removed from a stack and placed onto the middle surface 116. In the embodiment shown there are 12 vents but as few as one to more than 12 is contemplated based upon the diameter of the wafer and the geometry of the vent(s) 114. A slight radius or round 115 terminates the vent on the outside of the wafer separator 110 to disperse any venting air and prevent a concentrated stream of air. The wafer separator is configured without a rotational orientation therefore the wafer separator can be placed in any rotational orientation without requiring alignment of the vents 114.

Thus, specific embodiments of a single and dual stage wafer cushion and wafer separator have been disclosed. It should be apparent, however, to those skilled in the art that many more modifications besides those described are possible without departing from the inventive concepts herein. The inventive subject matter, therefore, is not to be restricted except in the spirit of the appended claims.

The invention claimed is:

1. A wafer separator comprising:
a compliant continuous ring having an outer edge and a bottom of cushion,
wherein when the ring is placed inside a silicon wafer shipper the bottom of cushion connects with a base of the wafer shipper while the outer edge is at a distance away from the base of the wafer shipper; and
wherein the outer edge is sized to provide clearance of the wafer shipper housing wall;
a mid-span elbow;
an inside hinge area
the outer edge comprises a top edge;
wherein the ring comprises a slope away from the outer edge and towards the bottom of cushion, such that when the ring is placed inside a silicon wafer shipper the top edge of the outer edge is the point furthest away from the base of the wafer shipper, and wherein the ring does not slope in the opposite direction; and
the ring defines an open central area.

2. The wafer separator according to claim 1 wherein said open central area provides clearance of components, bond pads, solder bumps, solder balls, post passivation interconnects, and conductor lines on an adjacent wafer.

3. The wafer separator according to claim 1 wherein said wafer is 200 or 300 mm in diameter.

4. The wafer separator according to claim 1 wherein said outer edge is sized to fit within a wafer carrier.

5. The wafer separator according to claim 1 wherein said wafer separator is made from a compliant material having a hardness of shore D of between 10 and 70.

6. The wafer separator according to claim 1 wherein said wafer separator does not have a rotational orientation.

7. The wafer separator according to claim 1 wherein the bottom surface is bonded to the housing of the wafer carrier.

* * * * *